US009727079B2

(12) United States Patent
Lieber et al.

(10) Patent No.: US 9,727,079 B2
(45) Date of Patent: Aug. 8, 2017

(54) CHASSIS INPUT/OUTPUT (I/O) MODULE FOR USE IN FRONT REGION OF MASS STORAGE CHASSIS ASSEMBLY

(71) Applicant: HGST Netherlands B.V., Amsterdam (NL)

(72) Inventors: Timothy G. Lieber, Colorado Springs, CO (US); Jeffrey D. Wilke, Palmer Lake, CO (US)

(73) Assignee: Western Digital Technologies, Inc., Irvine, CA (US)

( * ) Notice: Subject to any disclaimer, the term of this patent is extended or adjusted under 35 U.S.C. 154(b) by 44 days.

(21) Appl. No.: 14/490,525

(22) Filed: Sep. 18, 2014

(65) Prior Publication Data
US 2016/0085276 A1    Mar. 24, 2016

(51) Int. Cl.
| | |
|---|---|
| G06F 1/00 | (2006.01) |
| G06F 1/16 | (2006.01) |
| G06F 1/18 | (2006.01) |
| G11B 33/12 | (2006.01) |
| H05K 7/14 | (2006.01) |
| H05K 7/16 | (2006.01) |
| H05K 7/20 | (2006.01) |

(52) U.S. Cl.
CPC ............ *G06F 1/16* (2013.01); *G06F 1/183* (2013.01); *G06F 1/187* (2013.01); *G11B 33/128* (2013.01); *H05K 7/1491* (2013.01); *H05K 7/16* (2013.01); *H05K 7/20554* (2013.01); *H05K 7/20909* (2013.01)

(58) Field of Classification Search
None
See application file for complete search history.

(56) References Cited

U.S. PATENT DOCUMENTS

| | | | | |
|---|---|---|---|---|
| 6,018,456 | A | * 1/2000 | Young | ............... G06F 1/181 |
| | | | | 361/679.4 |
| 6,178,086 | B1 | * 1/2001 | Sim | ................. G06F 1/181 |
| | | | | 312/223.2 |
| 6,185,092 | B1 | 2/2001 | Landrum et al. | |

(Continued)

FOREIGN PATENT DOCUMENTS

| | | |
|---|---|---|
| JP | 2003-150319 A | 5/2003 |
| JP | 4108665 B2 | 6/2008 |

*Primary Examiner* — Courtney Smith
*Assistant Examiner* — Zhengfu Feng

(57) ABSTRACT

A chassis input/output (I/O) module adapted for use in a front region of a mass storage chassis assembly is provided. The chassis I/O module in one example includes an I/O module shell, a main I/O connector externally available on the I/O module shell, a plurality of sub-assembly connectors externally available on the I/O module shell, one or more power supply modules, and an interface module electrically coupled to the main I/O connector, the plurality of sub-assembly connectors, and the one or more power supply modules, with the interface module configured to regulate operations of one or more mass storage sub-assemblies installed in the mass storage chassis assembly, regulate provision of electrical power from the one or more power supply modules to the one or more mass storage sub-assemblies, and facilitate exchange of electrical signals between the one or more mass storage sub-assemblies and the main I/O connector.

19 Claims, 9 Drawing Sheets

(56) References Cited

U.S. PATENT DOCUMENTS

| | | | |
|---|---|---|---|
| 6,246,580 B1 * | 6/2001 | Weng | G06F 1/18 |
| | | | 174/16.1 |
| 6,862,173 B1 | 3/2005 | Konshak et al. | |
| 6,952,341 B2 | 10/2005 | Hidaka et al. | |
| 7,130,939 B2 | 10/2006 | Sumiyoshi et al. | |
| 7,346,913 B2 | 3/2008 | Ishimine et al. | |
| 7,380,088 B2 | 5/2008 | Wang et al. | |
| 7,516,272 B2 | 4/2009 | Felton et al. | |
| 7,542,300 B1 * | 6/2009 | Lui | G06F 1/183 |
| | | | 312/223.2 |
| 8,432,700 B2 | 4/2013 | Katakura et al. | |
| 8,976,530 B2 | 3/2015 | Jeffery et al. | |
| 2003/0030975 A1 | 2/2003 | Bestwick et al. | |
| 2005/0057909 A1 | 3/2005 | El-Batal et al. | |
| 2006/0010456 A1 | 1/2006 | Ishimine et al. | |
| 2007/0086172 A1 | 4/2007 | Lai et al. | |
| 2008/0239655 A1 * | 10/2008 | Oyama | G11B 33/128 |
| | | | 361/679.37 |
| 2008/0239656 A1 | 10/2008 | Sasagawa et al. | |
| 2011/0191514 A1 * | 8/2011 | Wu | G06F 1/26 |
| | | | 710/301 |
| 2011/0299237 A1 | 12/2011 | Liang | |

* cited by examiner

CHASSIS INPUT/OUTPUT (I/O) MODULE FOR USE IN FRONT REGION OF MASS STORAGE CHASSIS ASSEMBLY

BACKGROUND OF THE INVENTION

Field of the Invention

Aspects of the disclosure are related to the field of data storage systems, and in particular, to a mass storage chassis assembly.

Description of the Related Art

Mass storage systems are used for storing enormous quantities of digital data. As computer systems and networks grow in numbers and capability, there is a need for more and more storage system capacity. Cloud computing and large-scale data processing have further increase the need for digital data storage systems that are capable of transferring and holding immense amounts of data.

Mass storage systems are typically formed from a large number of mass storage devices. A mass storage chassis assembly is a modular unit that holds and operates a number of mass storage sub-assemblies. The capacity of a mass storage system can be increased in large increments by the installation of an additional mass storage chassis assembly or assemblies to a rack or other support structure.

A mass storage sub-assembly is a modular unit that can be added to a mass storage chassis assembly. Each mass storage sub-assembly mass storage sub-assembly holds and operates multiple storage devices, such as Hard Disk Drives (HDDs), for example. The storage capacity of a mass storage chassis assembly can be increased in increments by the installation of an additional mass storage sub-assembly or sub-assemblies to the chassis assembly.

Efficiency and ease-of-maintenance are of prime consideration in a mass storage system. It is important that technicians can easily and quickly access and install or service the components of a mass storage system. Further, it is highly desirable that components of a mass storage chassis assembly can be safely accessed by a technician.

SUMMARY OF THE INVENTION

A chassis input/output (I/O) module adapted for use in a front region of a mass storage chassis assembly is provided. The chassis I/O module in one example includes an I/O module shell, a main I/O connector externally available on the I/O module shell, a plurality of sub-assembly connectors externally available on the I/O module shell, one or more power supply modules, and an interface module electrically coupled to the main I/O connector, the plurality of sub-assembly connectors, and the one or more power supply modules, with the interface module configured to regulate operations of one or more mass storage sub-assemblies installed in the mass storage chassis assembly, regulate provision of electrical power from the one or more power supply modules to the one or more mass storage sub-assemblies, and facilitate exchange of electrical signals between the one or more mass storage sub-assemblies and the main I/O connector.

DETAILED DESCRIPTION OF THE INVENTION

The following description and associated drawings teach the best mode of the invention. For the purpose of teaching inventive principles, some conventional aspects of the best mode may be simplified or omitted. The following claims specify the scope of the invention. Some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by claims and their equivalents.

Figure 1:
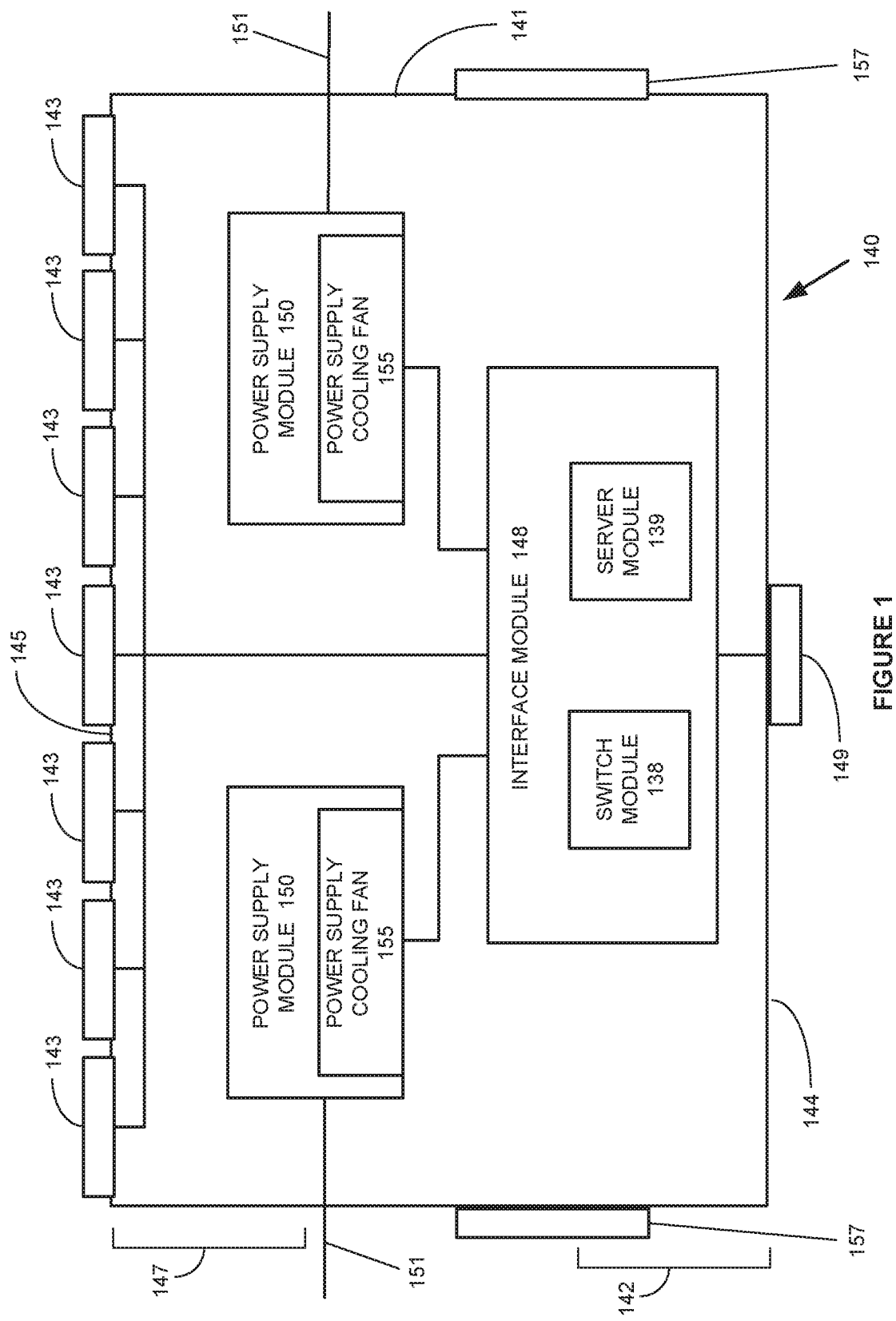
FIG. 1 shows an exemplary chassis input/output (I/) module for use in a mass storage chassis assembly.

FIG. 1 shows an exemplary chassis input/output (I/O) module 140 for use in a mass storage chassis assembly 100. The chassis I/O module 140 in the example shown includes an I/O module shell 141, a main I/O connector 149 available on an exterior surface of the I/O module shell 141, a plurality of sub-assembly connectors 143 available on the exterior surface of the I/O module shell 141, one or more retainer devices 157, one or more power supply modules 150, and an interface module 148.

The interface module 148 is coupled to and in communication with the main I/O connector 149 and is coupled to and in communication with the plurality of sub-assembly connectors 143. The interface module 148 relays electrical signals and data between the main I/O connector 149 and the plurality of sub-assembly connectors 143, including routing the electrical signals and data, i.e., multiplexing the plurality of sub-assembly connectors 143 to the main I/O connector 149. The interface module 148 is further coupled to the one or more power supply modules 150, wherein the interface module 148 regulates provision of electrical power from the one or more power supply modules 150 to the plurality of sub-assembly connectors 143. Electrical power supplied to the plurality of sub-assembly connectors 143 is used to power any installed mass storage sub-assemblies 120 (see FIG. 2). Electrical power supplied to the plurality of sub-assembly connectors 143 is also used to power one or more rear cooling fans 180 installed at a rear of the mass storage chassis assembly 100 (see FIG. 9).

The chassis I/O module 140 facilitates easy access by a technician or other operational personnel. The chassis I/O module 140 is mounted to a tray front region 111 of a mass storage chassis assembly 100. The chassis I/O module 140 is therefore located at a front aisle of a storage rack in a mass storage facility. The front aisle region is typically much cooler than a rear aisle region, where all cooling air flowing through the installed mass storage chassis assemblies 100 is exhausted. The front aisle region is a much better environment for control electronics, such as the interface module 148. Temperatures in the rear aisle region can reach about one hundred and thirty degrees Fahrenheit. The front aisle region is also much more hospitable for technicians and other operational personnel.

The main I/O connector 149 is located on a front surface 144 or module front region 142 of the chassis I/O module 140. The main I/O connector 149 comprises a main connector for the chassis I/O module 140 and for the mass storage chassis assembly 100. The main I/O connector 149 is configured to couple to an external bus, network, or system. The main I/O connector 149 exchanges signals or communications between the plurality of storage drive sub-assemblies 120 and one or more external devices or systems. All electrical signals exchanged between the mass storage chassis assembly 100 and external devices or systems pass through the main I/O connector 149. The main I/O connector 149 therefore includes suitable communication links, including electrical, optical, or other suitable communication links for transferring digital data.

The plurality of sub-assembly connectors 143 are located on the external surface of the I/O module shell 141 at a location that is spaced apart from the main I/O connector 149. In some examples, the plurality of sub-assembly connectors 143 are located on a rear surface 145 or module rear region 147. In some examples, the plurality of sub-assembly connectors 143 are located on an opposite external surface from the main I/O connector 149. The plurality of sub-assembly connectors 143 comprise connectors configured to couple to individual mass storage sub-assemblies 120.

The one or more power supply modules 150 provide electrical power to the mass storage chassis assembly 100. The one or more power supply modules 150 each receive an independent supply of electrical power via one or more corresponding power cables 151. Consequently, the mass storage chassis assembly 100 includes one or more independent and redundant power supply modules 150.

The plurality of sub-assembly connectors 143 are coupled to both of the power supply modules 150 via the interface module 148 in some examples. The plurality of sub-assembly connectors 143 transfer electrical power to the mass storage sub-assemblies 120, under control of the interface module 148. The two power supply modules 150 therefore provide redundant electrical power sources for the mass storage sub-assemblies 120.

The interface module 148 in the example shown is configured to control operations of the mass storage chassis assembly 100 so that digital data is efficiently stored and recalled from all mass storage sub-assemblies 120 installed in the mass storage chassis assembly 100. The interface module 148 relays electrical signals between the main I/O connector 149 and the plurality of sub-assembly connectors 143. The interface module 148 switches electrical signals between the main I/O connector 149 and individual mass storage sub-assemblies 120. In addition, the interface module 148 in some examples regulates the operation of individual mass storage sub-assemblies 120 of the mass storage chassis assembly 100. The interface module 148 can power on or off the individual mass storage sub-assemblies 120.

The interface module 148 in some examples receives sub-modules, including one or more switch modules 138 and one or more server modules 139. A desired number of switch modules 138 and server modules 139 can be installed in the interface module 148. Alternatively, or in addition, the one or more switch modules 138 and the one or more server modules 139 can be removed and replaced, such as to accommodate a particular use or configuration of the mass storage chassis assembly 100. The one or more switch modules 138 comprise switches for configuring one or more mass storage sub-assemblies 120. The one or more switch modules 138 comprise switches for controlling operation of one or more mass storage sub-assemblies 120. The one or more server modules 139 comprise circuitry for receiving electrical signals being exchanged between a mass storage sub-assembly or sub-assemblies 120 and an external device or system. The one or more server modules 139 comprise circuitry for routing electrical signals being exchanged between a mass storage sub-assembly or sub-assemblies 120 and an external device or system. The one or more server modules 139 comprise circuitry for interpreting and acting on received control signals that control operation of the chassis I/O module 140 and the mass storage chassis assembly 100.

Each power supply module 150 includes grills, meshes, or other venting features that allow air to flow through the power supply module 150, wherein air drawn through the mass storage chassis assembly 100 will cool the power supply module 150. In addition, in some examples a power supply module 150 includes a power supply cooling fan 155, wherein the power supply cooling fan 155 can be energized by the interface module 148 to assist in cooling the power supply module 150. Moreover, the power supply cooling fan 155 can be energized by the interface module 148 to assist in cooling the mass storage chassis assembly 100.

Further, in some examples the interface module 148 performs cooling functions, regulating the provision of electrical power to one or more rear cooling fans 180 at the rear of the mass storage chassis assembly 100. The interface module 148 is configured to measure temperatures at one or more locations within the mass storage chassis assembly 100 and regulate fan speed of the one or more rear cooling fans 180.

In operation, where the chassis I/O module 140 is installed to a mass storage chassis assembly 100 and the mass storage chassis assembly 100 is installed to a storage rack or other structure, the chassis I/O module 140 is located at the front of the mass storage chassis assembly 100 and at the front of the storage rack. The chassis I/O module 140 therefore can be quickly and easily accessed by a technician. The chassis I/O module 140 can be moved or removed to quickly and easily install or remove mass storage sub-assemblies 120. A technician can access the interface module 148 and quickly and easily install or remove switch modules 138 and server modules 139. A technician can quickly and easily install or remove power supply modules 150.

In some examples, the chassis I/O module 140 for use in a front region of a mass storage chassis assembly 100 comprises an I/O module shell 141, a main I/O connector 149 externally available on the I/O module shell 141, a plurality of sub-assembly connectors 143 externally available on the I/O module shell 141, one or more power supply modules 150, and an interface module 148 electrically coupled to the main I/O connector 149, the plurality of sub-assembly connectors 143, and the one or more power supply modules 150, with the interface module 148 configured to regulate operations of one or more mass storage sub-assemblies 120 installed in the mass storage chassis assembly 100, regulate provision of electrical power from the one or more power supply modules 150 to the one or more mass storage sub-assemblies 120, and facilitate exchange of electrical signals between the one or more mass storage sub-assemblies 120 and the main I/O connector 149.

Figure 2:
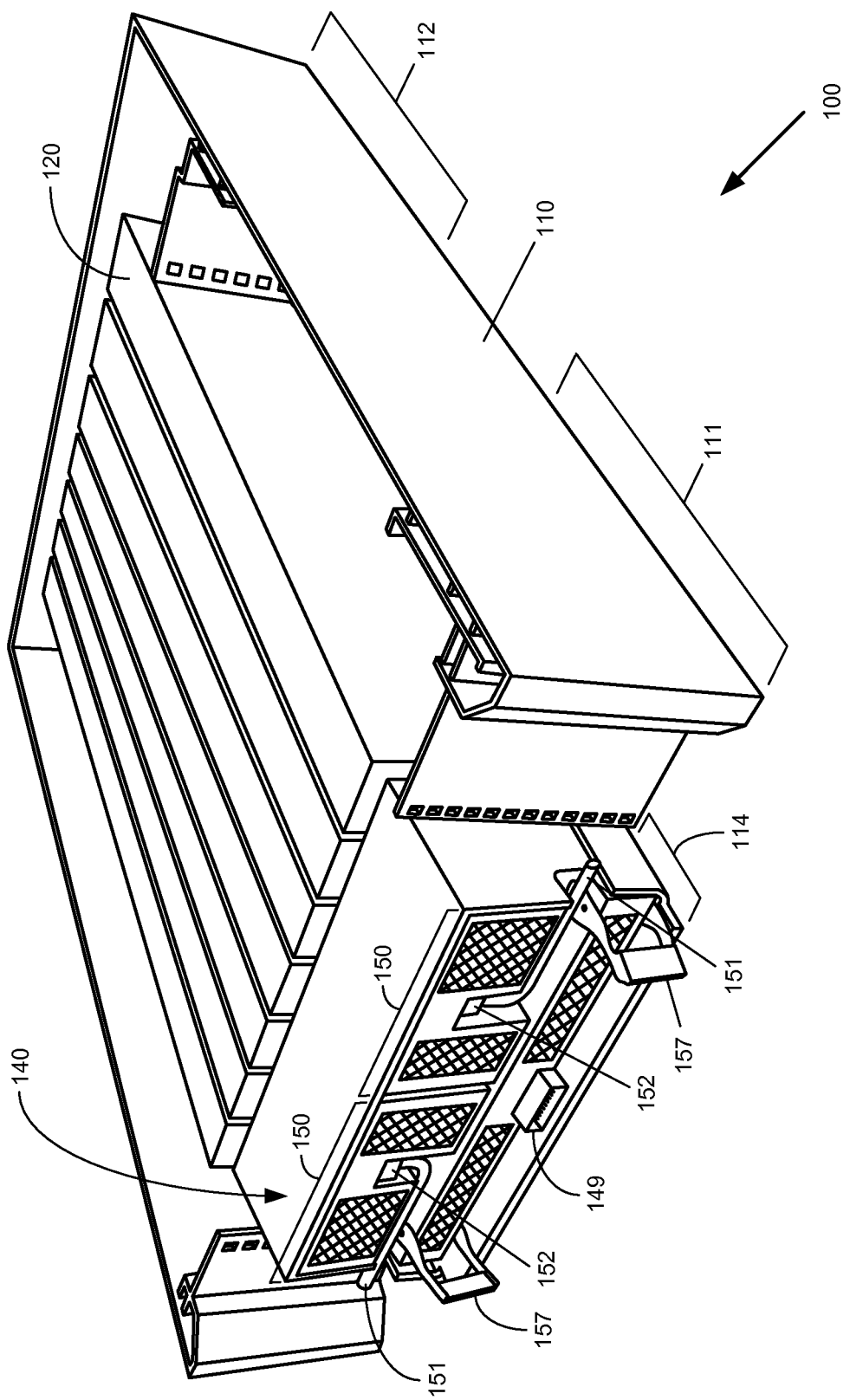
FIG. 2 shows an exemplary mass storage chassis assembly including an installed chassis I/O module.

FIG. 2 shows an exemplary mass storage chassis assembly 100 including an installed chassis I/O module 140. The mass storage chassis assembly 100 comprises a mass storage component configured to be installed into a rack or other structure of a digital data mass storage facility. A large increment of digital mass storage can be added to a digital storage facility by adding a mass storage chassis assembly 100.

The mass storage chassis assembly 100 comprises a chassis tray 110, one or more mass storage sub-assemblies 120 installed to the mass storage chassis assembly 100, and the chassis I/O module 140 installed to the mass storage chassis assembly 100. The chassis tray comprises a tray front region 111 and a tray rear region 112. The chassis tray 110 includes grooves, rails, apertures, projections, or other physical features that receive and hold the one or more mass storage sub-assemblies 120. The tray front region 111 includes an I/O module shelf 114 configured to receive the chassis I/O module 140. The chassis I/O module 140 is located in the tray front region 111, on the I/O module shelf 114, while the one or more mass storage sub-assemblies 120 extend substantially from the tray front region 111 to the tray rear region 112.

The chassis I/O module 140 electrically couples to the one or more mass storage sub-assemblies 120. The chassis I/O module 140 provides electrical power to the one or more mass storage sub-assemblies 120. The chassis I/O module 140 exchanges electrical signals with the one or more mass storage sub-assemblies 120 and with external systems or devices. The chassis I/O module 140 provides electrical power to and operates the one or more rear cooling fans 180 mounted at the tray rear region 112.

The I/O module shelf 114 includes grooves, rails, apertures, projections, or other physical features that enable the chassis I/O module 140 to be removably coupled to the chassis tray 110. The one or more retainer devices 157 of the chassis I/O module 140 are configured to removably affix the chassis I/O module 140 to the chassis tray 110. When the one or more retainer devices 157 are substantially engaged, the chassis I/O module 140 is affixed in position on the chassis tray 110 by the one or more retainer devices 157. When the one or more retainer devices 157 affix the chassis I/O module 140 in position, then the chassis I/O module 140 is mechanically and electrically coupled to the mass storage sub-assemblies 120 that are installed in the mass storage chassis assembly 100 and the plurality of sub-assembly connectors 143 of the chassis I/O module 140 engage sub-assembly connectors 123 of the mass storage sub-assemblies 120.

The one or more retainer devices 157 in one example comprise rotatable camming devices. The one or more retainer devices 157 in the example shown comprise rotatable cam devices that engage portions of the chassis tray 110 when rotated substantially to a retaining position. The one or more retainer devices 157 can be rotated when the chassis I/O module 140 is in substantially proper position in the chassis tray 110, wherein the one or more retainer devices 157 engage one or more corresponding retaining features 116. The one or more retaining features 116 in some examples comprise protrusions or depressions formed in the chassis tray 110.

Figure 3:
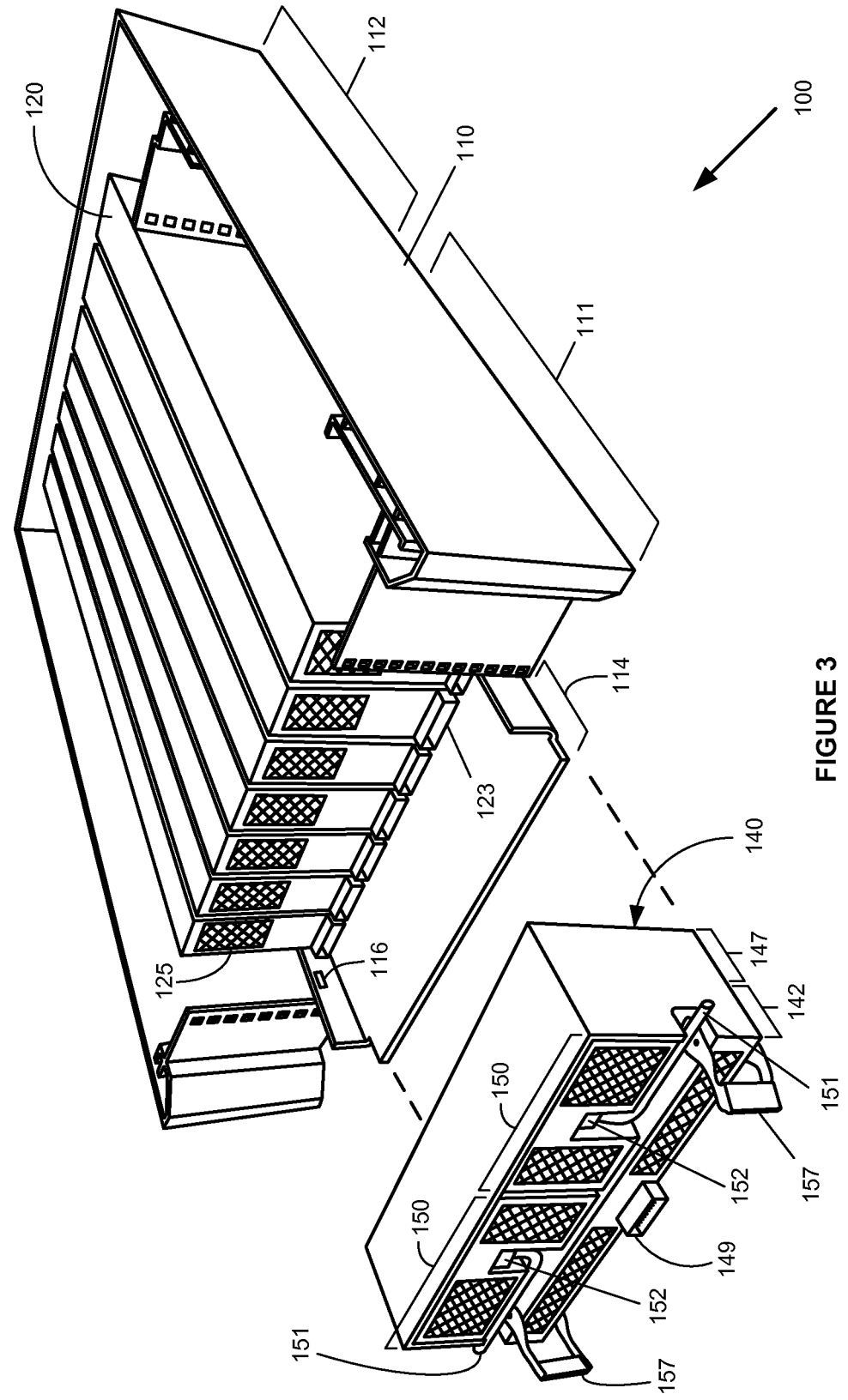
FIG. 3 shows the mass storage chassis assembly where the chassis I/O module is not installed to the chassis tray.

FIG. 3 shows the mass storage chassis assembly 100 where the chassis I/O module 140 is removed from the chassis tray 110. It can be seen that the one or more retaining features 116 are formed on the chassis tray 110. The one or more retaining features 116 comprise protrusions or indentations of predetermined dimensions, wherein the one or more retaining features 116 interact with the one or more retainer devices 157. The one or more retainer devices 157 contact the one or more retaining features 116 and affix the chassis I/O module 140 in the chassis tray 110.

In this figure, it can be seen that each mass storage sub-assembly 120 includes a corresponding sub-assembly connector 123. The sub-assembly connectors 123 of the mass storage sub-assemblies 120 are used to exchange electrical signals between the mass storage sub-assemblies 120 and the corresponding plurality of sub-assembly connectors 143 on a rear surface 145 of the chassis I/O module 140. In addition, the individual sub-assembly connectors 123 of the mass storage sub-assemblies 120 receive electrical power from the chassis I/O module 140. The electrical power operates the individual mass storage sub-assemblies 120.

It can be seen from the figure that each mass storage sub-assembly 120 includes an airflow window 125, including front and rear airflow windows 125. A front airflow window 125 of a mass storage sub-assembly 120 substantially matches up to a corresponding airflow window 153 on the rear surface 145 of the chassis I/O module 140. Airflow drawn through the mass storage chassis assembly 100 passes through the chassis I/O module 140 and into each airflow window 125 of each mass storage sub-assembly 120. The airflow cools the chassis I/O module 140. In addition, the airflow cools the mass storage sub-assemblies 120.

Figure 4:
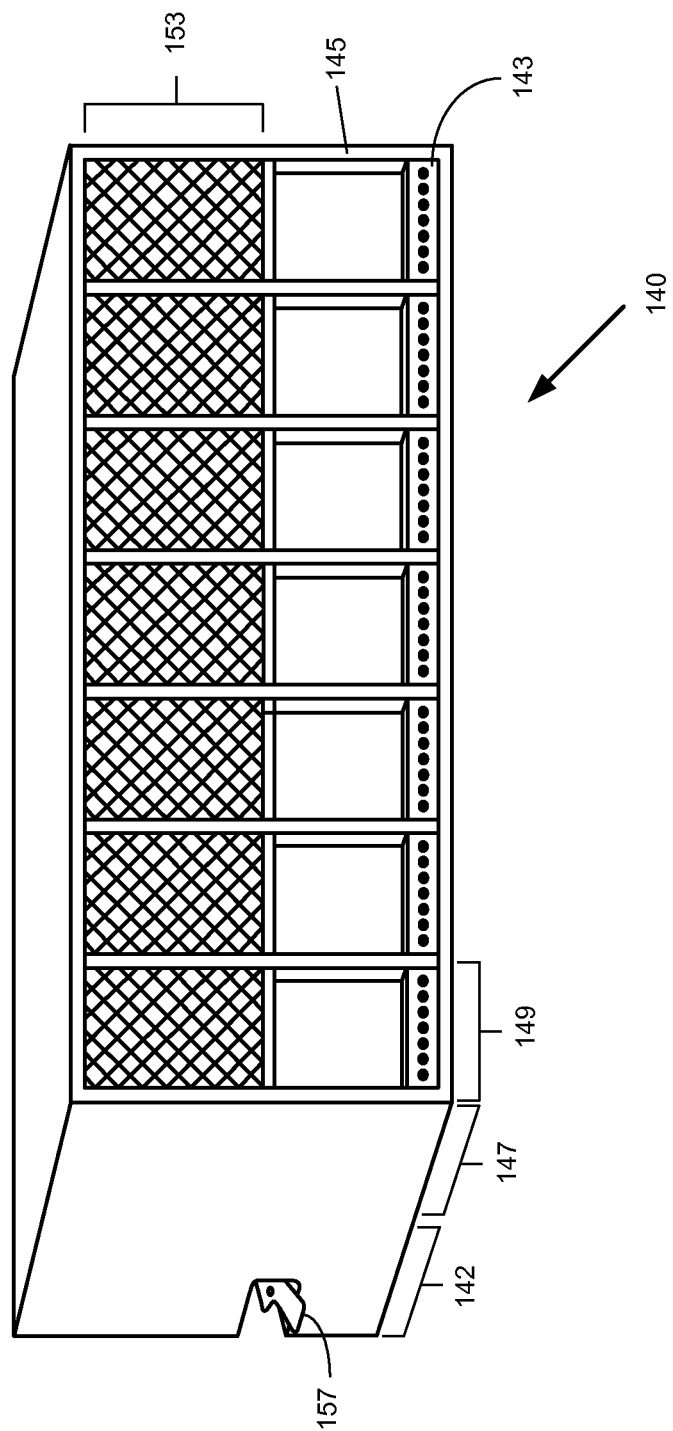
FIG. 4 shows a module rear region of the chassis I/O module, including the rear surface.

FIG. 4 shows a module rear region 147 of the chassis I/O module 140, including the rear surface 145. The module rear region 147 includes a plurality of interface regions 149 configured to substantially align with installed mass storage sub-assemblies 120. Each interface region 149 includes a sub-assembly connector 143 and an airflow window 153.

Figure 5:
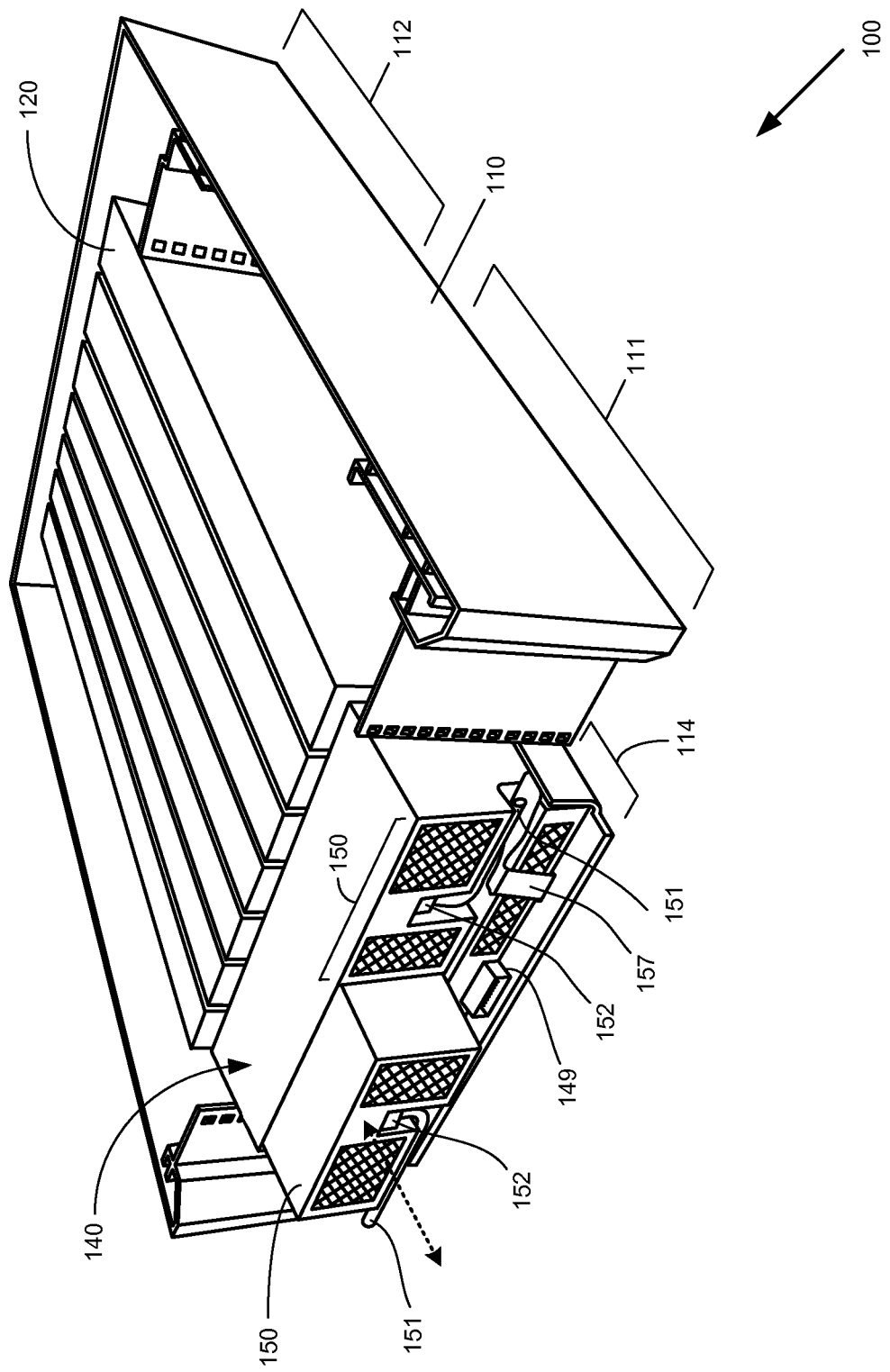
FIG. 5 shows the mass storage chassis assembly where a power supply module is partially removed from the chassis I/O module.

FIG. 5 shows the mass storage chassis assembly 100 where a power supply module 150 is partially removed from the chassis I/O module 140. Each power supply module 150 is configured to be received in a corresponding receptacle in the chassis I/O module 140. The one or more power supply modules 150 are individually removable from the chassis I/O module 140.

Figure 6:
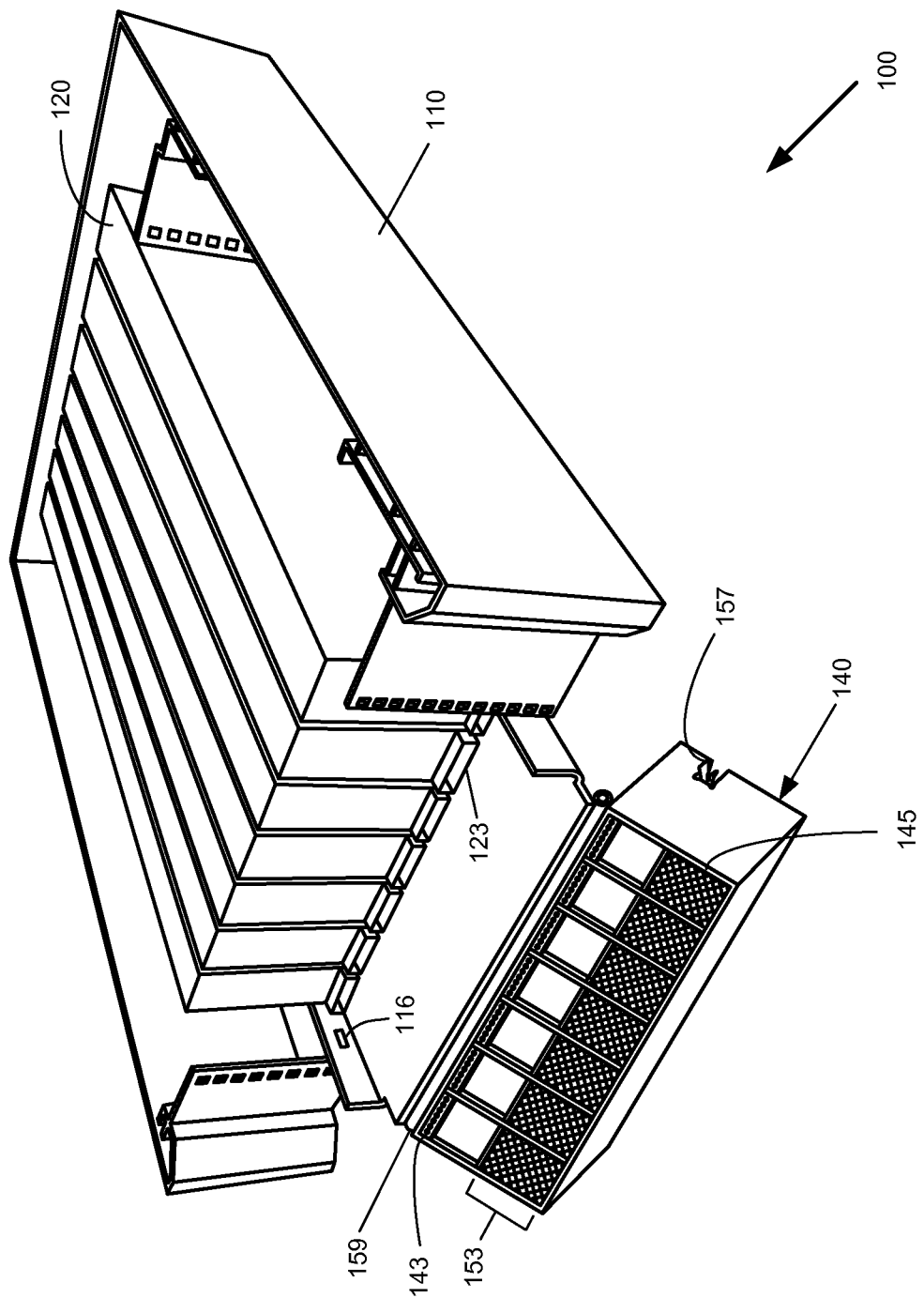
FIG. 6 shows the mass storage chassis assembly where the chassis I/O module is at least partially affixed to the I/O module shelf of the chassis tray by a hinge.

FIG. 6 shows the mass storage chassis assembly 100 where the chassis I/O module 140 is at least partially affixed to the I/O module shelf 114 of the chassis tray 110 by a hinge 159. The hinge 159 comprises a permanent or removable hinge. In some examples, the chassis I/O module 140 can slide relative to the hinge 159, wherein the chassis I/O module 140 can be pulled forward and rotated downward for access to the remainder of the mass storage chassis assembly 100.

Figure 7:
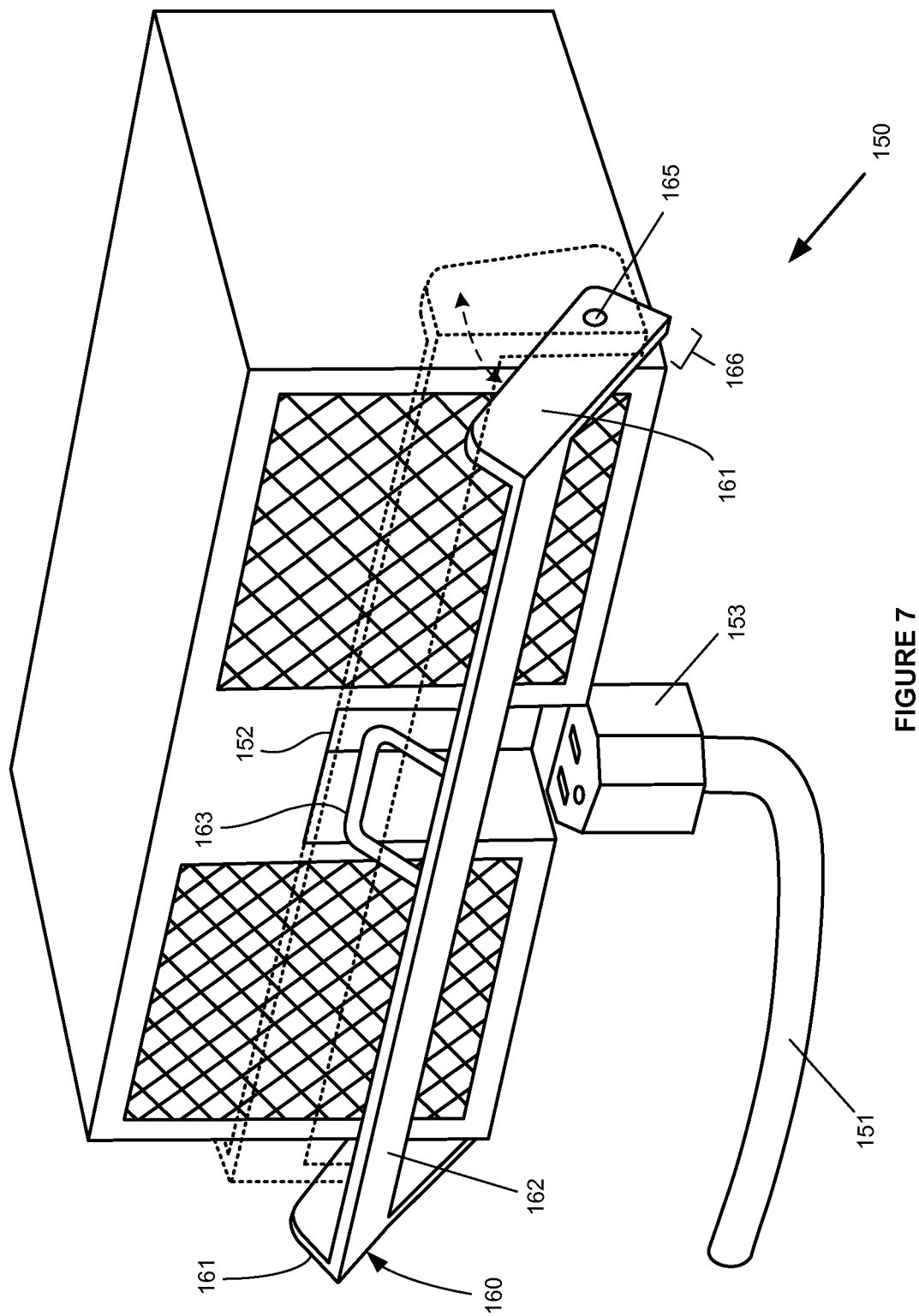
FIG. 7 shows a power supply module including a retainer device.

FIG. 7 shows a power supply module 150 including a retainer device 160. The retainer device 160 comprises end members 161 joined by a cross-member 162. The end members 161 are pivotably attached to the power supply module 150 by hinges 165. A power cable retainer loop 163 extends from a side of the cross-member 162. The power cable retainer loop 163 is configured to fit around the power cable connector 153 when power cable connector 153 is inserted into the power cable receptacle 152.

The retainer device 160 operates to hold the power supply module 150 in place in the chassis I/O module 140. It should be understood that the retainer device 160 ensures that the power cable 151 is removed from the power supply module 150 before the power supply module 150 is removed from the chassis I/O module 140.

In the figure, the dashed lines show the retainer device 160 in a first position. The first position comprises a secured position, wherein the power cable retainer loop 163 passes around either the power cable connector 153 or the power cable 151. With the power cable connector 153 in place, the retainer device 160 cannot be pivoted from the first, secured position. In the secured position, the bottom portions 166 of the end members 161 engage corresponding features in the chassis I/O module 140. The bottom portions 166 can include hooks, protrusions, camming features, or any other suitable device for retaining the power supply module 150 in the chassis I/O module 140.

In the figure, the solid lines show the retainer device 160 in a second position. The second position comprises an unsecured position, wherein the power cable connector 153 has been removed from the power cable receptacle 152 (and therefore has been removed from the power cable retainer loop 163). The bottom portions 166 of the end members 161 no longer engage the chassis I/O module 140. The power supply module 150 can now be removed from the chassis I/O module 140.

Figure 8:
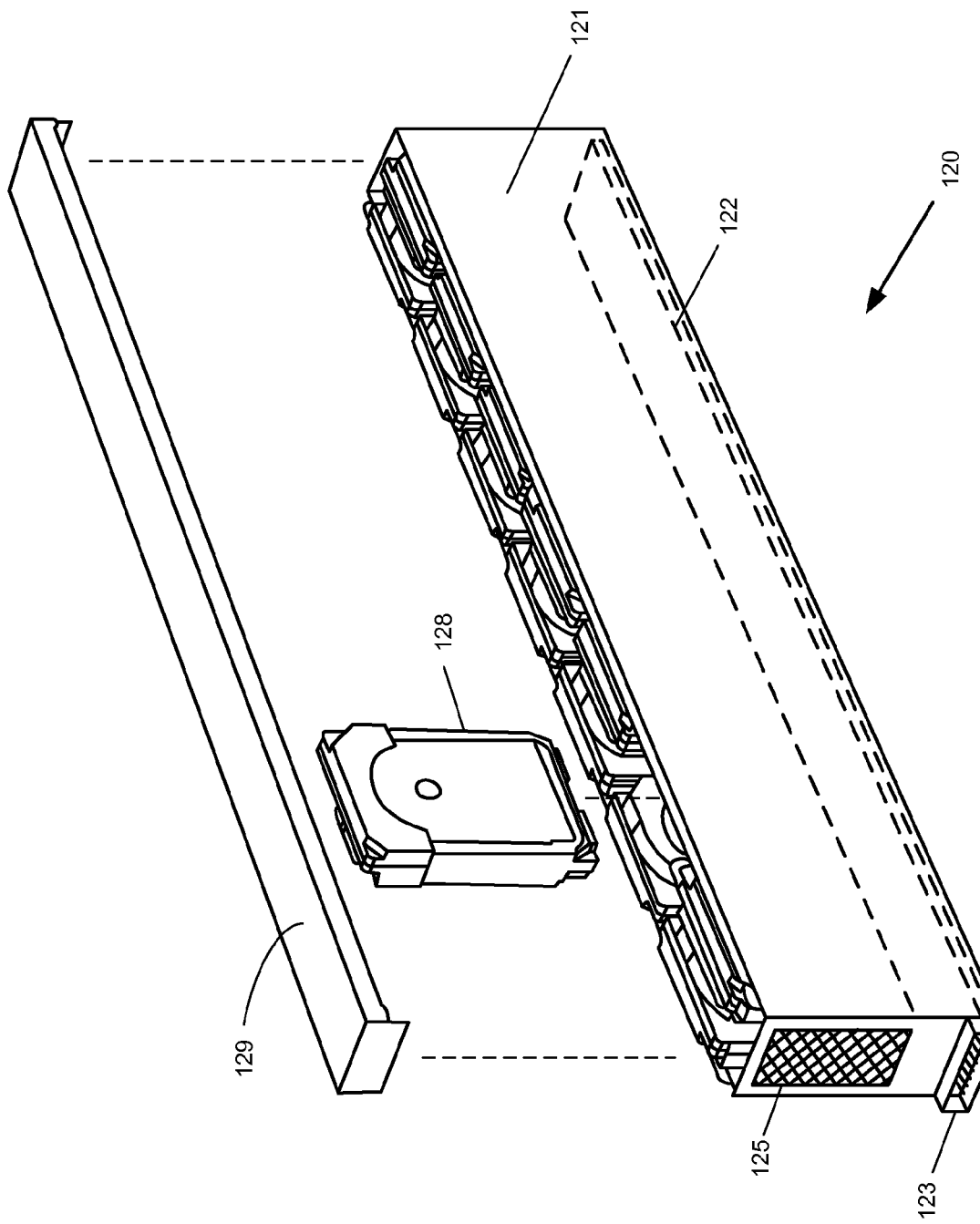
FIG. 8 shows detail of an exemplary mass storage sub-assembly.

FIG. 8 shows detail of an exemplary mass storage sub-assembly 120. The mass storage sub-assembly 120 includes a sub-assembly shell 121, the sub-assembly connector 123, a sub-assembly lid 129, and a plurality of storage drives 128 installed in the sub-assembly shell 121. In some examples, a storage drive comprises a digital storage device including one or more disk storage media, such as a hard disk drive (HDD). In addition, a storage drive can comprise a hybrid storage drive comprising one or more disk storage media combined with solid-state storage media.

The interior surface of the sub-assembly shell 121 can include any manner of guide or alignment mechanisms or features for receiving the plurality of storage drives 128. The interior surface of the sub-assembly shell 121 can include any manner of attachment or hold-down mechanisms or features for receiving the plurality of storage drives 128. It should be understood that the mass storage sub-assembly 120 can be used with any number of installed storage drives 128. Further, the exterior surface of the sub-assembly shell 121 can include mechanisms or features for installing the sub-assembly shell 121 into a mass storage chassis assembly 100 (or other receptacle or structure designed for receiving and operating mass storage sub-assemblies 120).

The sub-assembly shell 121 includes airflow windows 125 on the ends. The airflow windows 125 allow air to move lengthwise through the mass storage sub-assembly 120. The cooling airflow can travel around and/or through the individual storage drives 128 installed in the mass storage sub-assembly 120.

The sub-assembly connector 123 is affixed to a sub-assembly backplane 122 that extends along a bottom region of the sub-assembly shell 121 in the example shown. The sub-assembly connector 123 exchanges electrical signals for the mass storage sub-assembly 120, wherein digital data is stored on and retrieved from the mass storage sub-assembly 120. The sub-assembly connector 123 also provides electrical power to the mass storage sub-assembly 120. A plurality of backplane traces are coupled to the sub-assembly connector 123 and extend to connectors for each storage drive 128. The sub-assembly connector 123 can couple to a corresponding sub-assembly connector 143 of the chassis I/O module 140 when the mass storage sub-assembly 120 is installed into a mass storage chassis assembly 100.

Figure 9:
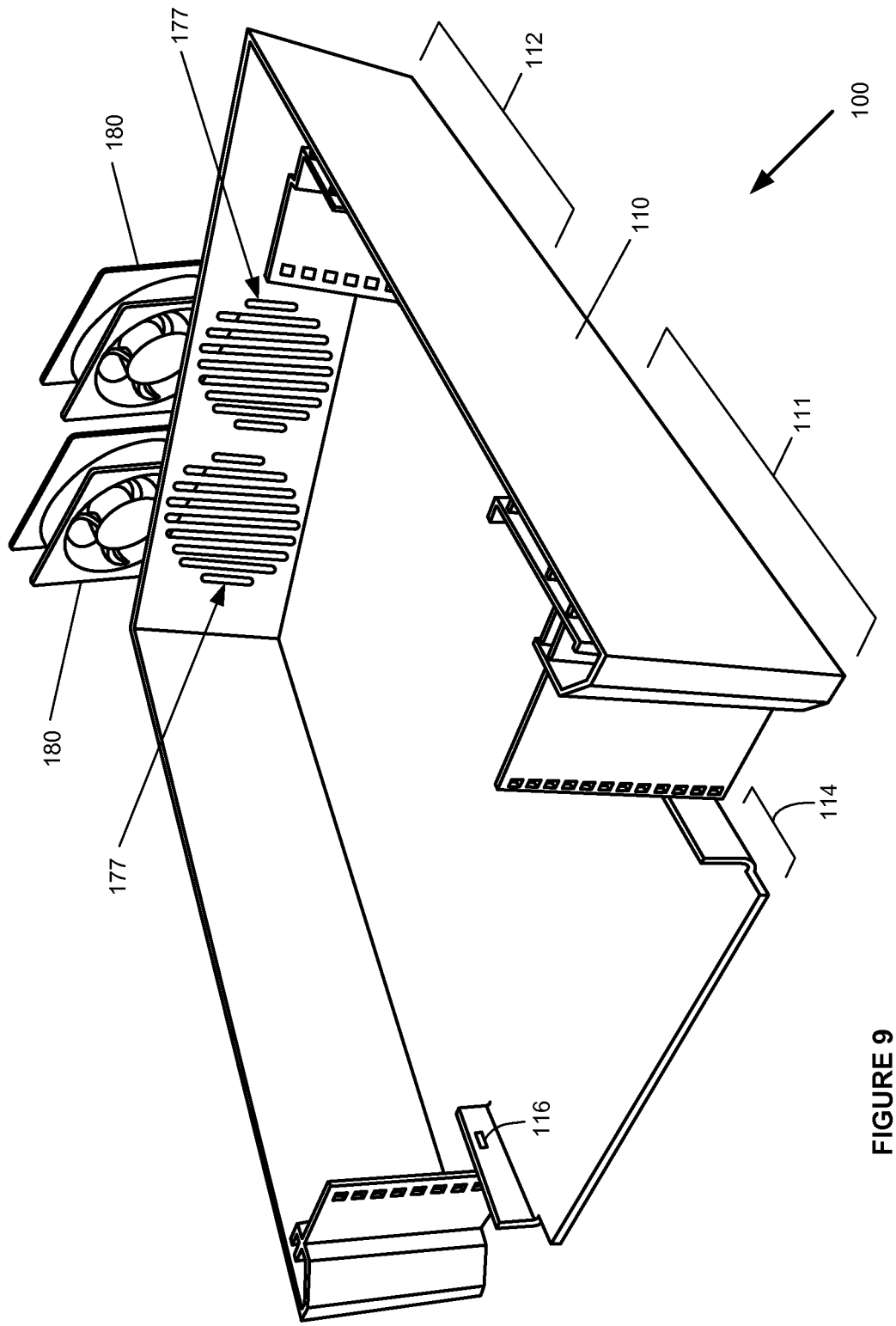
FIG. 9 shows the chassis tray including airflow features of a tray rear region.

FIG. 9 shows the chassis tray 110 including airflow features of a tray rear region 112. The chassis tray 110 in the example shown includes one or more airflow grills 177 formed in the tray rear region 112. One or more corresponding rear cooling fans 180 are positioned at the one or more airflow grills 177 and draw air through the mass storage chassis assembly 100. The one or more rear cooling fans 180 therefore also draw air through mass storage sub-assemblies 120 installed in the mass storage chassis assembly 100.

While the present invention has been particularly shown and described with reference to the preferred implementations, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A chassis input/output (I/O) module comprising:
   an I/O module shell;
   a main I/O connector externally available on the I/O module shell;
   a plurality of sub-assembly connectors externally available on the I/O module shell;
   one or more power supply modules positioned within the I/O module shell; and
   an interface module electrically coupled to the main I/O connector, the plurality of sub-assembly connectors, and the one or more power supply modules, wherein the interface module is configured to:
      regulate operations of one or more mass storage sub-assemblies installed in a mass storage chassis assembly;
      regulate provision of electrical power from the one or more power supply modules to the one or more mass storage sub-assemblies;
      facilitate exchange of electrical signals between the one or more mass storage sub-assemblies and the main I/O connector; and
      regulate provision of electrical power from the one or more power supply modules to one or more cooling fans to cause the one or more cooling fans to create a cooling airflow to flow toward the one or more mass storage sub-assemblies after passing through the I/O module shell.

2. The chassis I/O module of claim 1, wherein the chassis I/O module further comprises one or more retainer devices configured to removably affix the chassis I/O module to a chassis tray of the mass storage chassis assembly.

3. The chassis I/O module of claim 1, wherein the chassis I/O module further comprises one or more retainer devices configured to removably affix the I/O module shell to a chassis tray of the mass storage chassis assembly; and
   wherein the one or more retainer devices comprise one or more camming devices configured to engage corresponding retaining features in the chassis tray.

4. The chassis I/O module of claim 1, further comprising:
   a hinge configured to rotatably affix the I/O module shell to a chassis tray of the mass storage chassis assembly; and
   one or more retainer devices configured to removably affix the I/O module shell to the chassis tray when the chassis I/O module is substantially in an installed position in the chassis tray.

5. The chassis I/O module of claim 1, wherein a power supply module of the one or more power supply modules comprises:
   a retainer device pivotably attached to the power supply module; and a power cord retainer loop extending from the retainer device and configured to fit around a power cable connector;

wherein a first position of the power cord retainer loop is configured to prevent removal of the power supply module from the chassis I/O module unless a corresponding power cable has been removed;

wherein a second position of the power cord retainer loop is configured to allow removal of the power supply module from the chassis I/O module; and wherein the retainer device can be pivoted from the first position to the second position when the power cable is not present in the power cord retainer loop.

6. The chassis I/O module of claim 1, wherein the one or more cooling fans are located in a rear region of the mass storage chassis assembly.

7. The chassis I/O module of claim 1, wherein the one or more power supply modules comprise the one or more cooling fans.

8. A chassis input/output (I/O) module comprising:
an I/O module shell;
a main I/O connector externally available on the I/O module shell;
a plurality of sub-assembly connectors externally available on the I/O module shell;
one or more power supply modules;
an interface module electrically coupled to the main I/O connector, the plurality of sub-assembly connectors, and the one or more power supply modules, wherein the interface module is configured to:
regulate operations of one or more mass storage sub-assemblies installed in a mass storage chassis assembly;
regulate provision of electrical power from the one or more power supply modules to the one or more mass storage sub-assemblies;
facilitate exchange of electrical signals between the one or more mass storage sub-assemblies and the main I/O connector; and
regulate provision of electrical power from the one or more power supply modules to one or more cooling fans to cause the one or more cooling fans to create a cooling airflow to flow toward the one or more mass storage sub-assemblies after flowing through one or more power supply modules; and
one or more retainer devices configured to removably affix the I/O module shell to a chassis tray of the mass storage chassis assembly.

9. The chassis I/O module of claim 8, wherein the one or more retainer devices comprise one or more camming devices configured to engage corresponding retaining features in the chassis tray.

10. The chassis I/O module of claim 8, further comprising:
a hinge configured to rotatably affix the I/O module shell to the chassis tray; and
wherein the one or more retainer devices are configured to removably affix the I/O module shell to the chassis tray of the mass storage chassis assembly when the chassis I/O module is substantially in an installed position in the chassis tray.

11. The chassis I/O module of claim 8, wherein a power supply module of the one or more power supply modules comprises:
a retainer device pivotably attached to the power supply module; and a power cord retainer loop extending from the retainer device and configured to fit around a power cable connector;

wherein a first position of the power cord retainer loop is configured to prevent removal of the power supply module from the chassis I/O module unless a corresponding power cable has been removed;

wherein a second position of the power cord retainer loop is configured to allow removal of the power supply module from the chassis I/O module; and wherein the retainer device can be pivoted from the first position to the second position when the power cable is not present in the power cord retainer loop.

12. The chassis I/O module of claim 8, wherein the one or more cooling fans are located in a rear region of the mass storage chassis assembly.

13. The chassis I/O module of claim 8, wherein the one or more power supply modules comprise the one or more cooling fans.

14. A mass storage chassis assembly, comprising:
a chassis tray;
one or more cooling fans;
one or more mass storage sub-assemblies received in the chassis tray;
and a chassis input/output (I/O) module installed into the chassis tray, wherein the chassis I/O module comprises:
an I/O module shell;
a main I/O connector externally available on the I/O module shell;
a plurality of sub-assembly connectors externally available on the I/O module shell;
one or more power supply modules positioned internally within the I/O module shell; and
an interface module electrically coupled to the main I/O connector, the plurality of sub-assembly connectors, and the one or more power supply modules, wherein the interface module is configured to:
regulate operations of one or more mass storage sub-assemblies installed in the mass storage chassis assembly;
regulate provision of electrical power from the one or more power supply modules to the one or more mass storage sub-assemblies;
facilitate exchange of electrical signals between the one or more mass storage sub-assemblies and the main I/O connector; and
regulate provision of electrical power from the one or more power supply modules to the one or more cooling fans to cause the one or more cooling fans to create a cooling airflow to flow through the chassis tray from the I/O module shell toward the one or more mass storage sub-assemblies;
and wherein the one or more cooling fans are located in the one or more power supply modules.

15. The mass storage chassis assembly of claim 14, wherein the chassis I/O module further comprises one or more retainer devices configured to removably affix the chassis I/O module to the chassis tray.

16. The mass storage chassis assembly of claim 14, wherein the chassis I/O module further comprises one or more retainer devices configured to removably affix the I/O module shell to the chassis tray; and
wherein the one or more retainer devices comprise one or more camming devices configured to engage corresponding retaining features in the chassis tray.

17. The mass storage chassis assembly of claim 14, further comprising:

a hinge configured to rotatably affix the I/O module shell to the chassis tray; and one or more retainer devices configured to removably affix the I/O module shell to the chassis tray when the chassis I/O module is substantially in an installed position in the chassis tray.

18. The mass storage chassis assembly of claim 14, wherein a power supply module of the one or more power supply modules comprises:

a retainer device pivotably attached to the power supply module; and a power cord retainer loop extending from the retainer device and configured to fit around a power cable connector;

wherein a first position of the power cord retainer loop is configured to prevent removal of the power supply module from the chassis I/O module unless a corresponding power cable has been removed;

wherein a second position of the power cord retainer loop is configured to allow removal of the power supply module from the chassis I/O module; and wherein the retainer device can be pivoted from the first position to the second position when the power cable is not present in the power cord retainer loop.

19. The mass storage chassis assembly of claim 14, wherein the one or more cooling fans are located in a rear region of the chassis tray.

* * * * *